(12) United States Patent
Bazes

(10) Patent No.: US 6,469,579 B2
(45) Date of Patent: *Oct. 22, 2002

(54) BOOSTED HIGH GAIN, VERY WIDE COMMON MODE RANGE, SELF-BIASED OPERATIONAL AMPLIFIER

(75) Inventor: Mel Bazes, Haifa (IL)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/547,780

(22) Filed: Apr. 12, 2000

(65) Prior Publication Data

US 2002/0050859 A1 May 2, 2002

(51) Int. Cl.[7] ............................................. H03F 3/45
(52) U.S. Cl. ................................. 330/253; 330/257
(58) Field of Search ............................... 330/253, 257, 330/261, 311

(56) References Cited

U.S. PATENT DOCUMENTS

| | | | |
|---|---|---|---|
| 4,958,133 A | | 9/1990 | Bazes .......................... 330/253 |
| 5,442,318 A | * | 8/1995 | Badyal et al. ............... 330/253 |
| 5,621,374 A | * | 4/1997 | Harkin .................... 330/253 X |
| 5,748,040 A | * | 5/1998 | Leung ........................ 330/253 |
| 5,789,981 A | * | 8/1998 | Singer et al. ............ 330/257 X |
| 6,028,480 A | * | 2/2000 | Seevinck et al. ............ 330/257 |
| 6,064,267 A | * | 5/2000 | Lewyn .................... 330/257 X |
| 6,150,883 A | * | 11/2000 | Ivanov ......................... 330/253 |

FOREIGN PATENT DOCUMENTS

EP          028932      5/1981

OTHER PUBLICATIONS

Mel Bazes, "Two Novel Fully Complementary Self-Biased CMOS Differential Amplifiers", 1991 IEEE, pp. 165–168.

John A. Fisher and Rudolf Koch, "A Highly Linear CMOS Buffer Amplifier", IEEE Journal of Solid-State Circuits, vol. SC-22, No. 3, Jun. 1987, pp. 330–334.

Klaas Bult and Govert J.G.M. Geelen, "A Fast-Settling CMOS Op Amp for SC Circuits with 90-dB DC Gain", IEEE Journal of Solid-State Circuits, vol. 25, No. 6, Dec. 1990, pp. 1379–1384.

Richard E. Vallee and Ezz I. El-Masry, "A Very High-Frequency CMOS Complementary Folded Cascode Amplifier", IEEE Journal of Solid-State Circuits, vol. 29, No. 2, Feb. 1994, pp. 130–133.

Peter J. Holzmann et al., "A Low-Offset Low-Voltage CMOS OP AMP With Rail-To-Rail Input and Output Ranges", 1996 IEEE International Symposium On Circuits and Systems, May 12, 1996, pp. 179–182.

\* cited by examiner

Primary Examiner—Steven J. Mottola
(74) Attorney, Agent, or Firm—Seth Z. Kalson

(57) ABSTRACT

A boosted high gain, very wide common mode range, self-biased operational amplifier comprising complementary differential transistor pairs biased by biasing transistors and current mirrors, and comprising two amplifiers, each connected to bias an output cascode transistor so as to provide a very high amplifier output impedance, wherein the biasing transistors and current mirrors are all self-biased via negative feedback.

34 Claims, 2 Drawing Sheets

BOOSTED HIGH GAIN, VERY WIDE COMMON MODE RANGE, SELF-BIASED OPERATIONAL AMPLIFIER

FIELD

Embodiments of the present invention relate to analog circuits, and more particularly, to operational amplifiers.

BACKGROUND

Many prior art CMOS (Complementary-Metal-Oxide-Semiconductor) operational amplifiers rely upon external biasing in order to bias in the saturation region various FETs (Field-Effect-Transistor) that serve as current sources (or active loads) in the operational amplifiers. However, external biasing may be sensitive to process technology, supply voltage, and temperature. Furthermore, because the overall gain and output resistance of an operational amplifier may both be very high and difficult to accurately model, the output node voltages for zero differential input voltage is very difficult to predict. In general, these node voltages should be at or near $V_{cc}/2$ for zero differential input voltage, where $V_{cc}$ is the supply voltage.

Other prior art operational amplifiers have utilized various methods of self-biasing with negative feedback, so that the output node voltages are nominally at $V_{cc}/2$. However, for some of these prior art operational amplifiers, external biasing is not completely eliminated, and for others, some or all the FETs that serve as the current sources are biased in their linear region instead of their saturation region, resulting in reduced voltage gain. The present invention addresses these problems.

DESCRIPTION OF EMBODIMENTS

Figure 1:
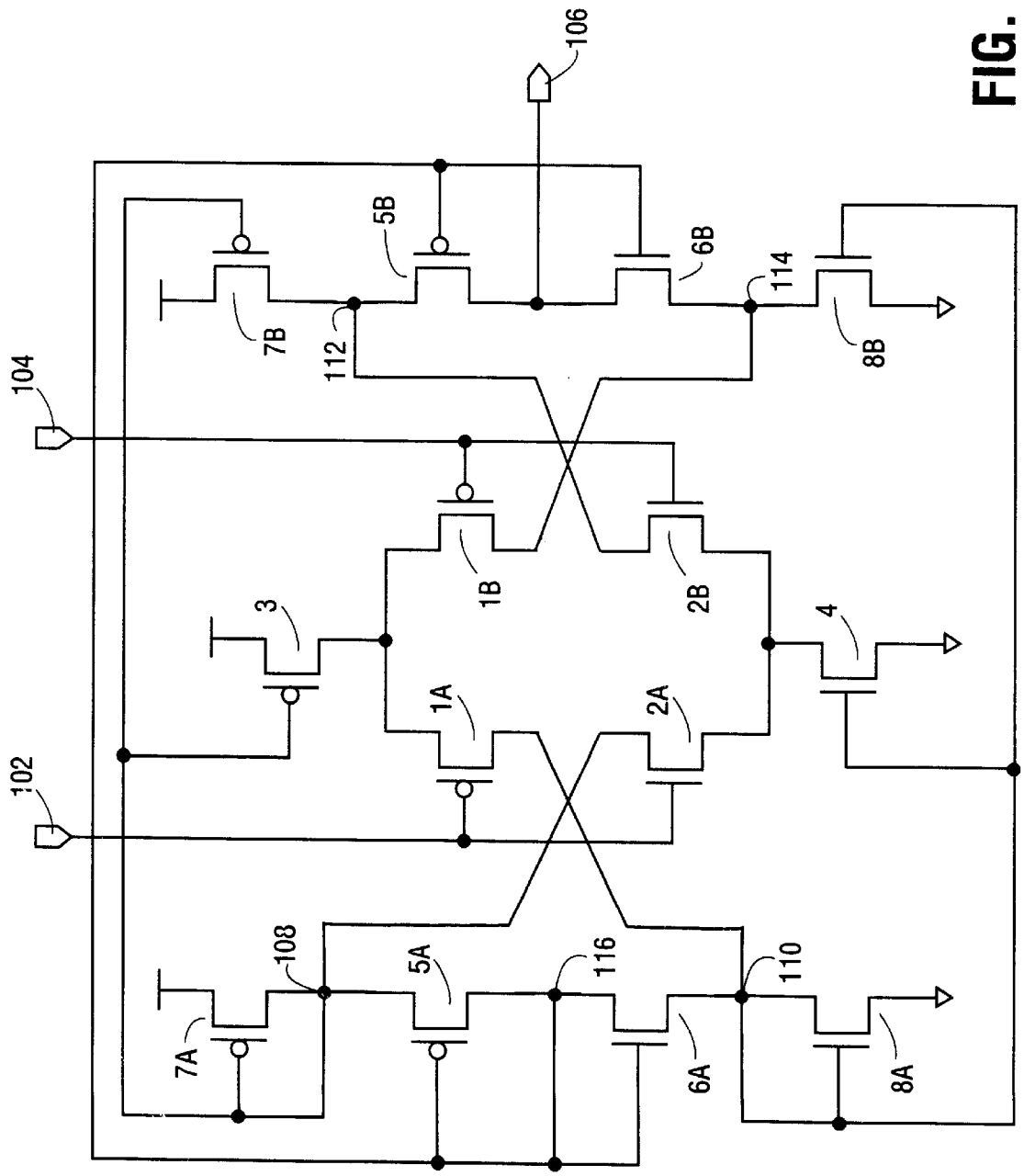
FIG. 1 is a circuit of an amplifier used as a building block in an embodiment of the present invention.

Before describing complete embodiments of the present invention, it is pedagogically useful to consider first the circuit of FIG. 1. The purpose of this is twofold. First, the circuit of FIG. 1 provides a building block for some, but not all, embodiments of the present invention. Second, it facilitates in understanding some of the circuit principles for embodiments of the present invention.

FIG. 1 is a circuit for a self-biased operational amplifier, and is the subject of United States patent application Ser. No. 09/547,748 filed Apr. 12, 2000, entitled "A High Gain, Very Wide Common Mode Range, Self-Biased Operational Amplifier," invented by the inventor of the present application, and assigned to the same assignee as the present application. The operational amplifier of FIG. 1 may be considered a transconductance amplifier, in that a small-signal current is provided to a load in response to a differential voltage at input nodes 102 and 104. The load in FIG. 1 may be taken as the output resistance of transistor 5B in parallel with transistor 6B. The operational amplifier of FIG. 1 is self-biasing because no external biasing is needed.

Transistors 1A and 1B are pMOSFETs (p-Metal-Oxide-Semiconductor-Field-Effect-Transistor) arranged as a first differential pair of transistors having their sources connected to each other, and transistors 2A and 2B are nMOSFETs arranged as a second differential pair having their sources connected to each other. The two differential pairs are complementary to each other in that they comprise transistors having complementary carrier types, i.e., transistors 1A and 1B are of p-carrier type and transistors 2A and 2B are of n-carrier type. The gates of transistors 1A and 2A are connected to input node 102, and the gates of transistors 1B and 2B are connected to input node 104.

Transistor 3 sources bias current to the differential pair 1A and 1B. Transistors 8A and 8B comprise a current mirror. Transistor 8A sinks bias currents from transistors 1A and 6A, and transistor 8B sinks bias currents from transistors 1B and 6B. The bias current sourced by transistor 3 is equal in magnitude to the sum of the bias currents sunk by transistors 1A and 1B. When the voltage differential between nodes 102 and 104 is zero, transistors 8A and 8B sink equal bias currents.

Similarly, transistors 7A and 7B comprise a current mirror. Transistor 7A sources bias currents to transistors 2A and 5A, and transistor 7B sources bias currents to transistors 2B and 2B. Transistor 4 sinks bias current from the differential pair 2A and 2B. The bias current sunk by transistor 4 is equal in magnitude to the sum of the bias currents sourced by transistors 2A and 2B. When the voltage differential between nodes 102 and 104 is zero, transistors 7A and 7B source equal bias currents.

The gate of transistor 7A is connected to its drain, as well as to the gates of transistors 3 and 7B. Because the gate of transistor 7A is connected to its drain, it is biased in its saturation region as long as its gate-source voltage $V_{GS}$ is more negative than $V_{TP}$, the pMOSFET threshold voltage. Consequently, transistors 3 and 7B are also biased in their saturation regions within a margin of $V_{TP}$. Similarly, the gate of transistor 8A is connected to its drain, as well as to the gates of transistors 4 and 8B. Because the gate of transistor 8A is connected to its drain, it is biased in its saturation region as long as its gate-source voltage $V_{GS}$ is more positive than $V_{TN}$, the nMOSFET threshold voltage. Consequently, transistors 4 and 8B are also biased in their saturation regions within a margin of $V_{TN}$.

Transistors 2B and 5B are arranged as a folded-cascode pair. Transistor 5B is a pMOSFET, so that the folded-cascode pair 2B and 5B is comprised of transistors having complementary carrier types. Cascode transistor 5B provides impedance translation. That is, the impedance at node 112 is very much smaller than the impedance at node 106. Similarly, transistors 1B and 6B are arranged as a folded-cascode pair with complementary carrier types, where the impedance at node 114 is much smaller than the impedance at node 106. The use of cascode transistors 5B and 6B provides a high output impedance, which helps to provide a high amplifier gain because gain is determined by the product of the input transconductance and the output impedance.

Transistors 5A and 2A, and transistors 6A and 1A, are arranged as folded-cascode pairs having complementary carrier types. The gate of transistor 5A is connected to its drain, and the gate of transistor 6A is connected to its drain, so that transistors 5A and 6A are biased in their saturation regions. The gates and drains of transistors 5A and 6A, which are at the same potential, are connected to the gates of transistors 5B and 6B and, thereby, bias them.

The complementary arrangement of the amplifier of FIG. 1 provides for a very wide common mode range of operation, as reasoned as follows. If the common mode input voltage is low such that transistors 2A and 2B are in cut-off, then transistors 1A and 1B will still be ON and will continue to amplify. Conversely, if the common mode input voltage is high such that transistors 1A and 1B are in cut-off, then transistors 2A and 2B will still be ON and will continue to amplify. In this way, the amplifier of FIG. 1 will provide amplification over a wide common mode input voltage range.

The self-biasing arrangement of the amplifier of FIG. 1 creates negative-feedback loops that stabilize the various bias voltages. Variations in processing parameters or operating conditions that shift the bias voltages away from their nominal values result in a shift in the bias voltages so as to be self-correcting.

Furthermore, the self-biasing arrangement of the embodiment of FIG. 1 also contributes to its differential gain, which may be heuristically argued as follows. Suppose input node 102 goes HIGH and input node 104 goes LOW. Small-signal current is drawn from nodes 108 and 110 by transistors 2A and 1A, respectively, and small-signal current is injected into nodes 112 and 114 by transistors 2B and 1B, respectively. With small-signal current injected into nodes 112 and 114, more current will be sourced into transistor 5B, and less current will be sunk from transistor 6B, and as a result, node 106 will go HIGH. In addition, because small-signal current is drawn from nodes 108 and 110, these nodes go LOW. Because the gates of transistors 3 and 7B are connected to node 108, they conduct more strongly, thereby causing the voltage at node 106 to go even higher. Furthermore, because the gates of transistors 4 and 8B are connected to node 110, these transistors conduct more weakly, thereby also causing the voltage at node 106 to go still even higher.

Figure 2:
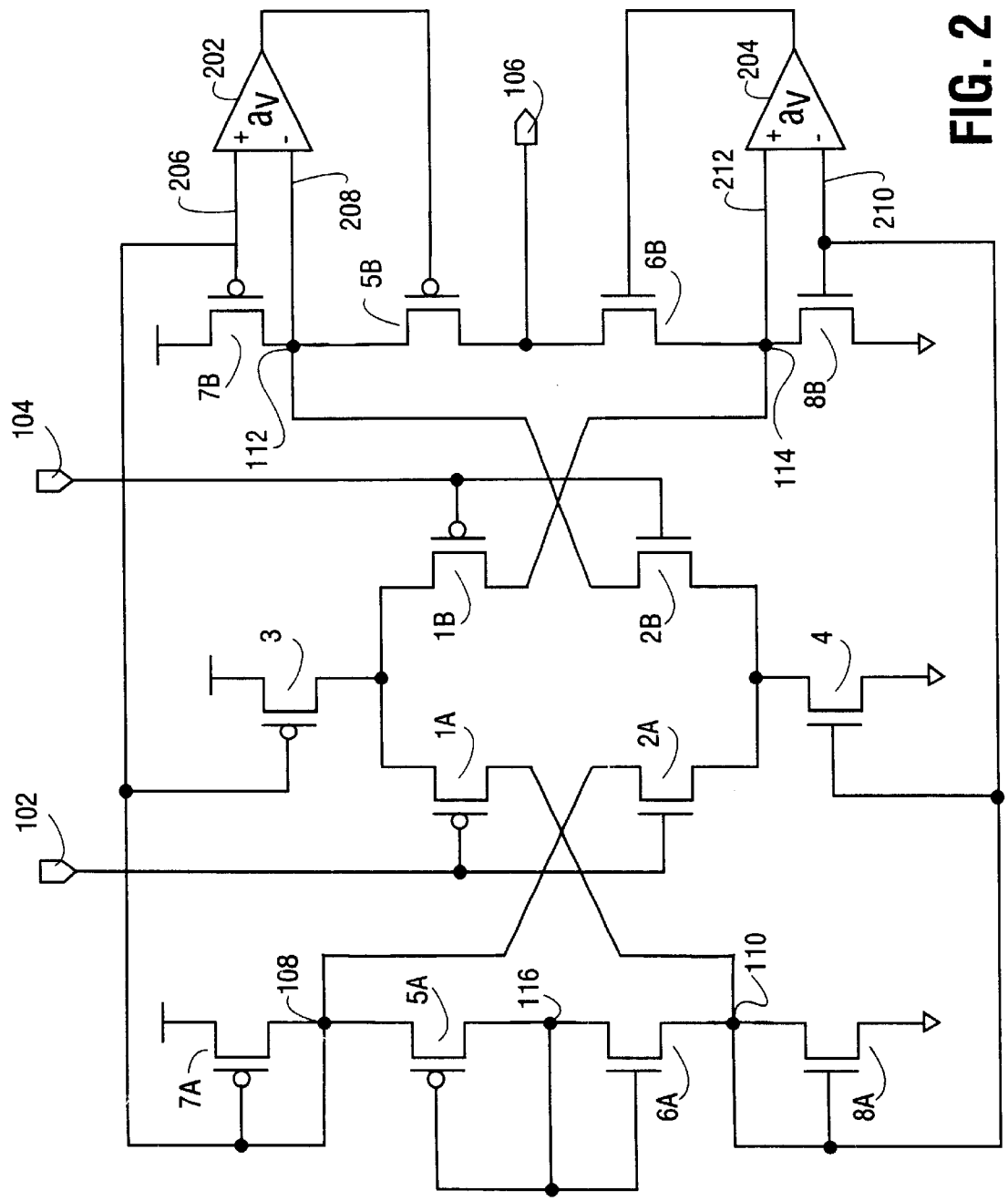
FIG. 2 is a circuit for an embodiment of the present invention incorporating the circuit of FIG. 1.

Now consider the circuit of FIG. 2, which is an embodiment of the present invention. As is clear from inspection of FIGS. 1 and 2, the circuit of FIG. 2 has many similarities with the circuit of FIG. 1. Consequently, components in FIG. 2 are labeled in the same way as their corresponding components in FIG. 1. However, note that in FIG. 2, the gates of transistors 5B and 6B are not biased by the gates of transistors 5A and 6A, as is the case for FIG. 1. But rather, in FIG. 2 the gate of transistor 5B is biased by the output of amplifier 202, and the gate of transistor 6B is biased by the output of amplifier 204.

Amplifiers 202 and 204 are high-gain, voltage amplifiers with high input impedance (e.g., operational amplifiers), with voltage gain denoted as $\alpha_v$. Amplifier 202 has non-inverting input node 206 connected to the gate of transistor 7B, and inverting input node 208 connected to node 112. Amplifier 204 has non-inverting input node 210 connected to the gate of transistor 8B, and inverting input node 212 connected to node 114. In the embodiment of FIG. 2, amplifiers 202 and 204 have the same gain $\alpha_v$, although this is not required for other embodiments.

As in the circuit of FIG. 1, the circuit of FIG. 2 has a first differential pair comprising transistors 1A and 1B, and a second differential pair comprising transistors 2A and 2B. The pairs of transistors 1B and 6B, 2B and 5B, 1A and 6A, and 2A and 5A are each arranged as a folded-cascode pair. Transistor 3 sources current to the sources of transistors 1A and 1B, and transistor 4 sinks current from the sources of transistors 2A and 2B. Transistors 7A, 3, and 7B are self-biased, where transistor 7A is self-biased in its saturation region. Similarly, transistors 8A, 4, and 8B are self-biased, where transistor 8A is self-biased in its saturation region. Transistors 5A and 6A are self-biased in their saturation regions.

The heuristic discussion for the circuit of FIG. 1 regarding the advantages of self-biasing and its contribution to high amplifier gain carry over to the circuit of FIG. 2, and will not be repeated to describe FIG. 2. However, the amplifier gain for the circuit of FIG. 2 may be much larger than that of FIG. 1, depending upon amplifiers 202 and 204. Indeed, it is shown below that the gain of the amplifier of FIG. 2 is $\alpha_v$ times the gain of the amplifier of FIG. 1. That is, denoting the small-signal gain of the amplifier of FIG. 1 by $\alpha$ and the small-signal gain of the amplifier of FIG. 2 by $\alpha_B$, it is shown below that $$\alpha_B = \alpha_v \alpha. \tag{1}$$

First consider the circuit of FIG. 1. The gain a is given by $$\alpha = g_m r_{out}, \tag{2}$$

where $g_m$ is the amplifier transconductance and $r_{out}$ is the amplifier small-signal output resistance. The amplifier output resistance is equal to the combination of the small-signal output resistance at node 106 when transistor 6B is open-circuited in parallel with the small-signal output resistance at node 106 when transistor 5B is open-circuited. Denoting the former and latter output resistances, respectively, as $r_{out5}$, and $r_{out6}$, the amplifier output resistance may be expressed as $$r_{out} = r_{out5} \| r_{out6}. \tag{3}$$

An approximate expression for the output resistance $r_{out5}$ may be derived as follows. Let $v_{out}$ denote the small-signal output voltage at output node 106, and let $i_{out5}$ denote the small-signal current at node 106 in the direction looking into the amplifier. Let $V_{s5}$ denote the small-signal voltage at the source (node 112) of transistor 5B, let $r_{ds5}$, denote the drain-source resistance of transistor 5B, and let $g_{m5}$ denote the transconductance of transistor 5B. Making the approximation that the self-biasing nature provides for a nearly constant bias voltage at the gate of transistor 5B, the small-signal gate-to-source voltage of transistor 5B is equal to the negative of $v_{s5}$. The low-frequency small-signal equivalent circuit for transistor 5B with $-V_{s5}$ substituted for the small-signal-to-source voltage of transistor 5B yields $$i_{out} = -g_{m5} v_{s5} + \frac{v_{out} - v_{s5}}{r_{ds5}}. \tag{4}$$

Let $r_{ds2}$ denote the drain-source resistance of transistor 2B. Because transistor 7B may be approximated as a constant current source, the small-signal current through transistor 2B is equal to $i_{out}$. With this approximation, and the approximation that the source voltage of transistor 2B is zero, and noting that the voltage at node 104 is held constant to compute the output resistance, the low-frequency small-signal equivalent circuit for transistor 2B yields $$i_{out} = \frac{v_{s5}}{r_{ds2}}. \tag{5}$$

Simultaneously solving equations (4) and (5) for $v_{out}$ yields $$v_{out} = \frac{v_{s5}}{r_{ds2}} (r_{ds5} + r_{ds2} + g_{m5} r_{ds5} r_{ds2}). \tag{6}$$

The output resistance $r_{out5}$ is $$r_{out5} = v_{out} / i_{out5}. \tag{7}$$

Substituting into equation (7) the expression for $i_{out}$ given by equation (5) and the expression for $v_{out}$ given by equation (6) yields $$r_{out5} = r_{ds5} + r_{ds2} + g_{m5} r_{ds5} r_{ds2} \approx g_{m5} r_{ds5} r_{ds2}. \tag{8}$$

A similar analysis for $r_{out6}$ gives $$r_{out6} \approx g_{m6} r_{ds6} r_{ds1}, \tag{9}$$

where $g_{m6}$ and $r_{ds6}$ are the transconductance and drain-source resistance, respectively, of transistor 6B, and $r_{ds1}$ is the drain-source resistance of transistor 1B.

Now consider the operational amplifier of FIG. 2. Because of the similarities between FIGS. 1 and 2, the amplifiers of FIG. 1 and FIG. 2 will have essentially the same transconductance, so that equation (2) for FIG. 2 now becomes $$\alpha_B = g_m r_{out}, \tag{10}$$

where $r_{out}$ in equation (10) is now the output resistance of the amplifier of FIG. 2. Again, equation (3) will hold for the amplifier of FIG. 2, in which now $r_{out5}$ and $r_{out6}$ are, respectively, the output resistances of the amplifier of FIG. 2 when transistors 6B and 5B are open-circuited.

Consequently, amplifier gain scales according to $r_{out5}$ and $r_{out6}$, and equation (1) follows by showing that $r_{out5}$ and $r_{out6}$ of the amplifier of FIG. 2 are each $\alpha_v$, times $r_{out5}$ and $r_{out6}$, respectively, of the amplifier of FIG. 1. This easily follows by noting that the gate-to-source voltage $v_{gs5}$ of transistor 5B in FIG. 2 is now given by $$v_{gs5} = -\alpha_v v_{s5} - v_{s5} = -v_{s5}(1 + \alpha_v). \tag{11}$$

Applying equation (11) to the low-frequency small-signal circuit for transistor 5B yields $$i_{out} = -g_{m5} v_{s5}(1 + a_v) + \frac{v_{out} - v_{s5}}{r_{ds5}}. \tag{12}$$

Equation (12) is identical to equation (4) if $g_{m5}$ in equation (4) is replaced with $g_{m5}(1+\alpha_v)$. Consequently, $r_{out5}$ and $r_{out6}$ for the amplifier of FIG. 2 are given, respectively, by $$r_{out5} \approx g_{m5}(1+\alpha_v) r_{ds5} r_{ds2} \approx g_{m5} \alpha_v r_{ds5} r_{ds2}, \tag{13}$$

and $$r_{out6} \approx g_{m6} \alpha_v r_{ds6} r_{ds1}, \tag{14}$$

and equation (1) therefore follows.

In one embodiment, the amplifiers 202 and 204 are each equivalent in structure to the self-biased operational amplifier of FIG. 1, so that equation (1) becomes $$\alpha_B = \alpha^2. \tag{15}$$

That is, with amplifiers 202 and 204 equivalent to the self-biased operational amplifier of FIG. 1, the gain for the operational amplifier of FIG. 2 is the square of that of FIG. 1. Furthermore, with amplifiers 202 and 204 equivalent to the self-biased operational amplifier of FIG. 1, the operational amplifier of FIG. 2 is completely self-biased.

Simulation results for the amplifier of FIG. 1 yield a gain of 91.8 dB, and simulation results for the amplifier of FIG. 2, with amplifiers 202 and 204 equivalent to that of FIG. 1, yield a gain of 181.7 dB, agreeing with equation (15).

In addition to achieving very high gain, the amplifier of FIG. 2 also has a very wide common mode range of operation. This follows from the complementary structure of the amplifier in FIG. 2 in much the same way as was described in reference to FIG. 1.

Various modifications may be made to the described embodiments without departing from the scope of the invention as claimed below.

I claim:

1. An amplifier comprising:
   a first differential pair comprising first and second transistors;
   a first cascode transistor coupled to the first transistor of the first differential pair to form a folded-cascode pair;
   a first current mirror comprising first and second transistors to sink, respectively, currents from the first and second transistors of the first differential pair, wherein the first transistor of the first current mirror is coupled to sink current from the first cascode transistor; and
   a first amplifier having an inverting input node coupled to the first transistor of the first differential pair, a non-inverting input node coupled to the first transistor of the first current mirror, and an output node coupled to control current flow in the first cascode transistor.

2. The amplifier as set forth in claim 1, wherein the second transistor of the first current mirror is coupled to be biased in saturation, and is coupled to bias the first transistor of the first current mirror and the non-inverting input node of the first amplifier at a bias voltage.

3. The amplifier as set forth in claim 1, further comprising:
   a second differential pair comprising first and second transistors;
   a second cascode transistor coupled to the first transistor of the second differential pair to form a folded-cascode pair;
   a second current mirror comprising first and second transistors to source, respectively, currents to the first and second transistors of the second differential pair, wherein the first transistor of the second current mirror is coupled to source current to the second cascode transistor; and
   a second amplifier having an inverting input node coupled to the first transistor of the second differential pair, a non-inverting input node coupled to the first transistor of the second current mirror, and an output node coupled to control current flow in the second cascode transistor.

4. The amplifier as set forth in claim 3, further comprising:
   a first node having a voltage, wherein the sum of currents sourced to the first node by the first transistor of the first differential pair and the first cascode transistor are substantially equal to current sunk from the first node by the first transistor of the first current mirror, wherein the inverting input node of the first amplifier is responsive to the voltage of the first node; and
   a second node having a voltage, wherein the sum of currents sunk from the second node by the first transistor of the second differential pair and the second cascode transistor are substantially equal to current sourced to the second node by the first transistor of the second current mirror, wherein the inverting input node of the second amplifier is responsive to the voltage of the second node; wherein
   the second transistor of the first current mirror is coupled to be biased in saturation, and is coupled to bias the first transistor of the first current mirror and the non-inverting input node of the first amplifier at a first bias voltage; and the second transistor of the second current mirror is coupled to be biased in saturation, and is coupled to bias the first transistor of the second current mirror and the non-inverting input node of the second amplifier at a second bias voltage.

5. The amplifier as set forth in claim 4, further comprising:

a first bias transistor to provide bias current to the first and second transistors of the first differential pair, wherein the second transistor of the second current mirror is coupled to bias the first bias transistor; and a second bias transistor to sink bias current from the first and second transistors of the second differential pair, wherein the second transistor of the first current mirror is coupled to bias the second bias transistor.

6. The amplifier as set forth in claim 5, further comprising:

a third cascode transistor coupled to the second transistor of the first differential pair to form a folded-cascode pair; and a fourth cascode transistor coupled to the second transistor of the second differential pair to form a folded-cascode pair;

wherein the third and fourth cascode transistors are coupled to be biased in saturation.

7. An operational amplifier to provide an output voltage as an amplified output of a differential of first and second input voltages, the operational amplifier comprising:

a first input node at the first input voltage;

a second input node at the second input voltage;

an output node at the output voltage;

a first differential pair comprising first and second transistors;

a first cascode transistor coupled to the first transistor of the first differential pair to form a folded-cascode pair;

a second differential pair comprising first and second transistors; wherein the first transistors of the first and second differential pairs are coupled to the first input node to be responsive to the first input voltage, and the second transistors of the first and second differential pair are coupled to the second input node to be responsive to the second input voltage;

a second cascode transistor coupled to the first transistor of the second differential pair to form a folded-cascode pair;

a first current mirror comprising first and second transistors to sink, respectively, current from the first and second transistors of the first differential pair, wherein the first transistor of the first current mirror is coupled to sink current from the first cascode transistor;

a second current mirror comprising first and second transistors to source, respectively, current to the first and second transistors of the second differential pair, wherein the first transistor of the second current mirror is coupled to source current to the second cascode transistor;

a first operational amplifier having an inverting input node coupled to the first transistor of the first differential pair, having a non-inverting input coupled to the first transistor of the first current mirror, and having an output node coupled to control current flow in the first cascode transistor; and a second operational amplifier having an inverting input node coupled to the first transistor of the second differential pair, having a non-inverting input coupled to the first transistor of the second current mirror, and having an output node coupled to control current flow in the second cascode transistor;

wherein the first and second cascode transistors are coupled to the output node to provide the output voltage.

8. The operational amplifier as set forth in claim 7, wherein the first and second transistors of the first differential pair, the second cascode transistor, and the first and second transistors of the second current mirror are pFETs; and the first and second transistors of the second differential pair, the first cascode transistor, and the first and second transistors of the first current mirror are nFETs.

9. The amplifier as set forth in claim 7, further comprising:

a first bias transistor to source bias current to the first and second transistors of the first differential pair;

a second bias transistor to sink bias current from the first and second transistors of the second differential pair;

a third cascode transistor coupled to the second transistor of the first differential pair to form a folded-cascode pair; and a fourth cascode transistor coupled to the second transistor of the second differential pair to form a folded-cascode pair.

10. The operational amplifier as set forth in claim 9, wherein the first and second transistors of the first differential pair, the second cascode transistor, the first and second transistors of the second current mirror, the first bias transistor, and the fourth cascode transistor are pFETs; and the first and second transistors of the second differential pair, the first cascode transistor, the first and second transistors of the first current mirror, the second bias transistor, and the third cascode transistor are nFETs.

11. The operational amplifier as set forth in claim 9, wherein the second transistors of the first and second current mirrors, and the third and fourth cascode transistors are coupled to be in saturation;

the second transistor of the first current mirror is coupled to bias the second bias transistor, the first transistor of the first current mirror, and the non-inverting input node of the first operational amplifier; and the second transistor of the second current mirror is coupled to bias the first bias transistor, the first transistor of the second current mirror, and the non-inverting input node of the second operational amplifier.

12. The operational amplifier as set forth in claim 11, further comprising:

a first node having a voltage, wherein the sum of currents sourced to the first node by the first transistor of the first differential pair and the first cascode transistor are substantially equal to current sunk from the first node by the first transistor of the first current mirror, wherein the inverting input node of the first amplifier is responsive to the voltage of the first node; and a second node having a voltage, wherein the sum of currents sunk from the second node by the first transistor of the second differential pair and the second cascode transistor are substantially equal to current sourced to the second node by the first transistor of the second current mirror, wherein the inverting input node of the second amplifier is responsive to the voltage of the second node.

13. An operational amplifier comprising:

a first differential pair comprising first and second unipolar transistors of a first carrier type, each having a drain, a gate, and a source;

a first cascode unipolar transistor of a second carrier type complementary to the first carrier type, having a gate, having a drain, and having a source connected to the drain of first transistor of the first differential pair;

a first current mirror comprising first and second unipolar transistors of the second carrier type, each having a gate, a drain, and a source, wherein the drain of the second transistor of the first current mirror is connected to its gate, to the drain of the second transistor of the first differential pair, and to the gate of the first transistor of the first current mirror, and wherein the drain of the first transistor of the first current mirror is connected to the drain of the first transistor of the first differential pair; and a first operational amplifier having an inverting input node connected to the source of the first cascode transistor, having a non-inverting input node connected to the gate of the first transistor of the first current mirror, and having an output node connected to the gate of the first cascode transistor.

14. The operational amplifier as set forth in claim 13, further comprising:

a second differential pair comprising first and second unipolar transistors of the second carrier type, each having a drain, a gate, and a source;

a second cascode unipolar transistor of the first carrier type having a gate, having a drain, and having a source connected to the drain of first transistor of the second differential pair;

a second current mirror comprising first and second unipolar transistors of the first carrier type, each having a gate, a drain, and a source, wherein the drain of the second transistor of the second current mirror is connected to its gate, to the drain of the second transistor of the second differential pair, and to the gate of the first transistor of the second current mirror, and wherein the drain of the first transistor of the second current mirror is connected to the drain of the first transistor of the second differential pair; and a second operational amplifier having an inverting input node connected to the source of the second cascode transistor, having a non-inverting input node connected to the gate of the first transistor of the second current mirror, and having an output node connected to the gate of the second cascode transistor.

15. The operational amplifier as set forth in claim 14, further comprising:

a first bias unipolar transistor of the first carrier type having a drain connected to the sources of the first and second transistors of the first differential pair, and having a gate connected to the gate of the second transistor of the second current mirror;

a second bias unipolar transistor of the second carrier type having a drain connected to the sources of the first and second transistors of the second differential pair, and having a gate connected to the gate of the second transistor of the first current mirror;

a third cascode unipolar transistor of the second carrier type having a source connected to the drain of the second transistor of the first current mirror, having a gate, and having a drain connected to its gate; and a fourth cascode unipolar transistor of the first carrier type having a source connected to the drain of the second transistor of the second current mirror, having a gate connected to the gate of the third cascode transistor, and having a drain connected to its gate.

16. The operational amplifier as set forth in claim 15, further comprising:

a first input node connected to the gates of the first transistors of the first and second differential pairs;

a second input node connected to the gates of the second transistors of the first and second differential pairs; and an output node connected to the drains of the first and second cascode transistors.

17. An amplifier comprising:

a first differential pair comprising first and second transistors;

a first cascode transistor coupled to the first transistor of the first differential pair to form a folded-cascode pair, the first cascode transistor having a gate;

a first current mirror comprising first and second transistors to sink, respectively, currents from the first and second transistors of the first differential pair, wherein the first transistor of the first current mirror is coupled to sink current from the first cascode transistor; and a first amplifier having an inverting input node coupled to the first transistor of the first differential pair, a non-inverting input node coupled to the first transistor of the first current mirror, and an output node connected to the gate of the first cascode transistor.

18. The amplifier as set forth in claim 17, wherein the second transistor of the first current mirror is coupled to be biased in saturation, and is coupled to bias the first transistor of the first current mirror and the non-inverting input node of the first amplifier at a bias voltage.

19. The amplifier as set forth in claim 17, further comprising:

a second differential pair comprising first and second transistors;

a second cascode transistor coupled to the first transistor of the second differential pair to form a folded-cascode pair, the second cascode transistor having a gate;

a second current mirror comprising first and second transistors to source, respectively, currents to the first and second transistors of the second differential pair, wherein the first transistor of the second current mirror is coupled to source current to the second cascode transistor; and a second amplifier having an inverting input node coupled to the first transistor of the second differential pair, a non-inverting input node coupled to the first transistor of the second current mirror, and an output node connected to the gate of the second cascode transistor.

20. The amplifier as set forth in claim 19, further comprising:

a first node, wherein the sum of currents sourced to the first node by the first transistor of the first differential pair and the first cascode transistor are substantially equal to current sunk from the first node by the first transistor of the first current mirror, wherein the inverting input node of the first amplifier is connected to the first node; and a second node, wherein the sum of currents sunk from the second node by the first transistor of the second differential pair and the second cascode transistor are substantially equal to current sourced to the second node by the first transistor of the second current mirror, wherein the inverting input node of the second amplifier is connected to the second node; wherein the second transistor of the first current mirror is coupled to be biased in saturation, and is coupled to bias the first transistor of the first current mirror and the non-inverting input node of the first amplifier at a first bias voltage; and the second transistor of the second current mirror is coupled to be biased in saturation, and is coupled to bias the first transistor of the second current mirror and the non-inverting input node of the second amplifier at a second bias voltage.

21. The amplifier as set forth in claim 20, further comprising:

a first bias transistor to provide bias current to the first and second transistors of the first differential pair, wherein the second transistor of the second current mirror is coupled to bias the first bias transistor; and a second bias transistor to sink bias current from the first and second transistors of the second differential pair, wherein the second transistor of the first current mirror is coupled to bias the second bias transistor.

22. The amplifier as set forth in claim 21, further comprising:

a third cascode transistor coupled to the second transistor of the first differential pair to form a folded-cascode pair; and a fourth cascode transistor coupled to the second transistor of the second differential pair to form a folded-cascode pair;

wherein the third and fourth cascode transistors are coupled to be biased in saturation.

23. An operational amplifier to provide an output voltage as an amplified output of a differential of first and second input voltages, the operational amplifier comprising:

a first input node at the first input voltage;

a second input node at the second input voltage;

an output node at the output voltage of the operational amplifier;

a first pFET comprising a source, a drain, and a gate coupled to the first input node to be responsive to the first input voltage;

a first nFET comprising a gate, and a drain coupled to the drain of the first pFET to sink current from the first pFET;

a second nFET comprising a source, a drain, and a gate coupled to the second input node to be responsive to the second input voltage;

a second pFET comprising a gate, and a drain coupled to the drain of the second nFET to source current to the second nFET, wherein the gate and drain of the second pFET are coupled to each other to have substantially the same voltage;

a third pFET comprising a gate, and a drain coupled to the source of the first pFET to source current to the first pFET, wherein the gates of the third pFET and second pFET are coupled to each other to have substantially the same voltage;

a third nFET comprising a source, a drain, and a gate coupled to the first input node to be responsive to the first input voltage;

a fourth pFET comprising a gate, wherein the gates of the fourth pFET and second pFET are coupled to each other to have substantially the same voltage, and comprising a drain coupled to the drain of the third nFET to source current to the third nFET;

a fifth pFET comprising a gate coupled to the second input node to be responsive to the second input voltage, a source coupled to the drain of the third pFET to sink current from the third pFET, and a drain;

a fourth nFET comprising a gate and a drain, wherein the gate and drain of the fourth nFET are coupled to each other to have substantially the same voltage, wherein the gates of the fourth nFET and first nFET are coupled to each other to have substantially the same voltage, and the drain of the fourth nFET is coupled to the drain of the fifth pFET to sink current from the fifth pFET;

a fifth nFET comprising a gate, wherein the gates of the fifth nFET and fourth nFET are coupled to each other to have substantially the same voltage, and comprising a drain coupled to the sources of the second nFET and third nFET to sink current from the second nFET and third nFET;

a sixth pFET comprising a source coupled to the drain of the second pFET to sink current from the second pFET, a gate, and a drain, wherein the gate and drain of the sixth pFET are coupled to each other to have substantially the same voltage;

a sixth nFET comprising a gate and a drain coupled to each other to have substantially the same voltage, wherein the gates of the sixth nFET and sixth pFET are coupled to each other to have substantially the same voltage, and comprising a drain coupled to the drain of the sixth pFET to sink current from the sixth pFET, and a source coupled to the drain of the fourth nFET to source current to the fourth nFET;

a seventh pFET comprising a source coupled to the drain of the fourth pFET to sink current from the fourth pFET, comprising a gate, and comprising a drain coupled to the output node of the operational amplifier;

a seventh nFET comprising a gate, comprising a drain coupled to the drain of the seventh pFET to sink current from the seventh pFET, and a source coupled to the drain of the first nFET to source current to the first nFET;

a first amplifier comprising a non-inverting input node responsive to the voltage of the gate of the first nFET, comprising an inverting input node responsive to the voltage of the source of the seventh nFET, and comprising an output node so that the voltage of the gate of the seventh nFET is responsive to the voltage of the output node of the first amplifier; and a second amplifier comprising a non-inverting input node responsive to the voltage of the gate of the fourth pFET, comprising an inverting input node responsive to the voltage of the source of the seventh pFET, and comprising an output node so that the voltage of the gate of the seventh pFET is responsive to the voltage of the output node of the second amplifier.

24. An amplifier comprising:

a first differential pair comprising first and second pMOS-FETs;

a first cascode nMOSFET coupled to the first pMOSFET of the first differential pair to form a folded-cascode pair, the first cascode nMOSFET having a gate;

a first current mirror comprising first and second nMOS-FETs to sink, respectively, currents from the first and second pMOSFETs of the first differential pair, wherein the second nMOSFET of the first current mirror has a gate and a drain coupled to each other to be self-biased, wherein the first nMOSFET of the first current mirror has a gate coupled to the gate of the second nMOSFET of the first current mirror to be self-biased and has a drain coupled to the first cascode nMOSFET to sink current; and a first amplifier to provide negative feedback from the drain of the first nMOSFET of the first current mirror to the gate of the first cascode nMOSFET.

25. The amplifier as set forth in claim 24, further comprising:

a second differential pair comprising first and second nMOSFETs;

a first cascode pMOSFET coupled to the first nMOSFET of the second differential pair to form a folded-cascode pair;

a second current mirror comprising first and second pMOSFETs to source, respectively, currents to the first and second nMOSFETs of the second differential pair, wherein the second pMOSFET of the second current mirror has a gate and a drain coupled to each other to be self-biased, wherein the first pMOSFET of the second current mirror has a gate coupled to the gate of the second pMOSFET of the second current mirror to be self-biased and has a drain coupled to the first cascode pMOSFET to source current; and a second amplifier to provide negative feedback from the drain of the first pMOSFET of the second current mirror to the gate of the first cascode pMOSFET.

26. The amplifier as set forth in claim 25, further comprising:

a bias pMOSFET to provide bias pMOSFET having a gate coupled to the gate of the second pMOSFET of the second current mirror to be self-biased; and a bias nMOSFET to sink bias current from the first and second nMOSFETs of the second differential pair, the bias nMOSFET having a gate coupled to the gate of the second nMOSFET of the first current mirror to be self-biased.

27. The amplifier as set forth in claim 26, further comprising:

a second cascode nMOSFET coupled to the second pMOSFET of the first differential pair to form a folded-cascode pair, the second cascode nMOSFET having a gate and a drain coupled to each other to be self-biased; and a second cascode pMOSFET coupled to the second nMOSFET of the second differential pair to form a folded-cascode pair, the second cascode pMOSFET having a gate and a drain coupled to each other and to the gate of second cascode nMOSFET to be self-biased.

28. An amplifier comprising:

a first differential pair comprising first and second pMOSFETs;

a first cascode nMOSFET coupled to the first pMOSFET of the first differential pair to form a folded-cascode pair, the first cascode nMOSFET having a gate;

a first current mirror comprising first and second nMOSFETs to sink, respectively, currents from the first and second pMOSFET of the first current mirror has a gate and drain connected to each other, wherein the first nMOSFET of the first current mirror has a gate connected to the gate of the second nMOSFET of the first current mirror and has a drain coupled to the first cascode nMOSFET to sink current; and a first amplifier to provide negative feedback from the drain of the first nMOSFET of the first current mirror to the gate of the first cascode nMOSFET.

29. The amplifier as set forth in claim 28, further comprising:

a second differential pair comprising first and second nMOSFETs;

a first cascode pMOSFET coupled to the first nMOSFET of the second differential pair to form a folded-cascode pair;

a second current mirror comprising first and second pMOSFET to source, respectively, currents to the first and second nMOSFETs of the second differential pair, wherein the second pMOSFET of the second current mirror has a gate and a drain connected to each other, wherein the first pMOSFET of the second current mirror has a gate connected to the gate of the second pMOSFET of the second current mirror and has a drain coupled to the first cascode pMOSFET to source current; and a second amplifier to provide negative feedback from the drain of the first pMOSFET of the second current mirror to the gate of the first cascode pMOSFET.

30. The amplifier as set forth in claim 29, further comprising:

a bias pMOSFET to provide bias current to the first and second pMOSFETs of the first differential pair, the bias pMOSFET having a gate connected to the gate of the second pMOSFET of the second current mirror; and a bias nMOSFET to sink bias current from the first and second nMOSFETs of the second differential pair, the bias nMOSFET having a gate connected to the gate of the second nMOSFET of the first current mirror.

31. The amplifier as set forth in claim 30, further comprising:

a second cascode nMOSFET coupled to the second pMOSFET of the first differential pair to form a folded-cascode pair, the second cascode nMOSFET having a gate and a drain connected to each other; and a second cascode pMOSFET coupled to the second nMOSFET of the second differential pair to form a folded-cascode pair, the second cascode pMOSFET having a gate and a drain connected to each other and to the gate of second cascode nMOSFET.

32. An amplifier comprising:

a first differential pair comprising first and second unipolar transistors of a first carrier type, each having a drain, a gate, and a source;

a first cascode current mirror comprising first and second unipolar transistors of the second carrier type, each having a gate, a drain, and a source, wherein the drain of the second transistor of the first current mirror is connected to its gate, to the drain of the second transistor of the first differential pair, and to the gate of the first transistor of the first current mirror, and wherein the drain of the first transistor of the first current mirror is connected to the drain of the first transistor of the first differential pair; and a first amplifier to provide negative feedback from the source of the first cascode unipolar transistor to the gate of the first cascode transistor.

33. The amplifier as set forth in claim 32, further comprising:
- a second differential pair comprising first and second unipolar transistors of the second carrier type, each having a drain, a gate, and a source;
- a second cascode unipolar transistors of the first carrier type having a gate, having a drain, and having a source connected to the drain of first transistor of the second differential pair;
- second current mirror comprising first and second unipolar transistors of the first carrier type, each having a gate, a drain, and a source, wherein the drain of the second transistor of the second current mirror is connected to its gate, to the drain of the second transistor of the second differential pair, and to the gate of the first transistor of the second current mirror, and wherein the drain of the first transistor of the second differential pair; and
- a second amplifier to provide negative feedback from the source of the second cascode transistor to the gate of the second cascode transistor.

34. The amplifier as set forth in claim 33, further comprising:
- a first bias unipolar transistor of the first carrier type having a drain connected to the sources of the first and second transistors of the differential pair, and having a gate connected to the gate of the second transistor of the second current mirror;
- a second bias unipolar transistor of the second carrier type having a drain connected to the sources of the first and second transistors of the second differential pair, and having a gate connected to the gate of the second transistor of the carrier current mirror;
- a third cascode unipolar transistor of the second carrier type having a source connected to the drain of the second transistor of the first current mirror, having a gate, and having a drain connected to its gate; and
- a fourth cascode unipolar transistor of the first carrier type having a source connected to the drain of the second transistor of the second current mirror, having a gate connected to the gate of the third cascode transistor, and having a drain connected to its gate.

* * * * *